United States Patent
Kikuchi

(10) Patent No.: US 8,638,379 B2
(45) Date of Patent: Jan. 28, 2014

(54) SOLID-STATE IMAGE PICKUP DEVICE WITH SHARED AMPLIFIER NEAREST PIXEL CORRESPONDING TO SHORTEST LIGHT WAVELENGTH AND ELECTRONIC APPARATUS USING THE SAME

(75) Inventor: Koji Kikuchi, Kanagawa (JP)

(73) Assignee: Sony Corporation (JP)

( * ) Notice: Subject to any disclaimer, the term of this patent is extended or adjusted under 35 U.S.C. 154(b) by 408 days.

(21) Appl. No.: 12/637,840

(22) Filed: Dec. 15, 2009

(65) Prior Publication Data

US 2010/0157116 A1 Jun. 24, 2010

(30) Foreign Application Priority Data

Dec. 22, 2008 (JP) ................................. 2008-325073

(51) Int. Cl.
*H04N 5/335* (2011.01)
*H04N 3/14* (2006.01)
*H01L 27/00* (2006.01)

(52) U.S. Cl.
USPC .......................... 348/272; 348/308; 250/208.1

(58) Field of Classification Search
USPC ................ 348/246, 248, 272, 308; 250/208.1
See application file for complete search history.

(56) References Cited

U.S. PATENT DOCUMENTS

| 2004/0051798 A1* | 3/2004 | Kakarala et al. | 348/246 |
| 2006/0038904 A1* | 2/2006 | Kudoh | 348/308 |
| 2006/0192262 A1* | 8/2006 | Kikuchi | 257/443 |
| 2008/0180555 A1* | 7/2008 | Sato et al. | 348/248 |
| 2009/0184349 A1* | 7/2009 | Dungan | 257/292 |
| 2009/0309008 A1* | 12/2009 | Lee | 250/208.1 |

FOREIGN PATENT DOCUMENTS

| JP | 2006-054276 | 2/2006 |
| JP | 2006-173634 | 6/2006 |
| JP | 2006-237361 | 9/2006 |
| JP | 2007-115994 | 5/2007 |
| JP | 2008-072589 | 3/2008 |
| JP | 2008-098476 | 4/2008 |
| JP | 2008-172607 | 7/2008 |
| JP | 2008-244021 | 10/2008 |
| JP | 2010-063120 | 3/2010 |

OTHER PUBLICATIONS

Japanese Patent Office Action dated Nov. 16, 2010 corresponding to Japanese Serial No. 2008-325073.
JP Application No. 2008-325073; Office Action issued Mar. 1, 2011; 3 pages.
Japanese Patent Office Action corresponding to Japanese Serial No. 2008-325073 dated Aug. 31, 2008.

* cited by examiner

*Primary Examiner* — Roberto Velez
*Assistant Examiner* — Joel Fosselman
(74) *Attorney, Agent, or Firm* — Sheridan Ross P.C.

(57) ABSTRACT

An embodiment of the invention provides a solid-state image pickup device, including a pixel portion in which a plurality of light receiving areas corresponding to different wavelengths, respectively, are disposed, and transistors used commonly to the plurality of adjacent light receiving areas in the pixel portion, and disposed so as to be brought near to a side of the light receiving area, corresponding to the shorter wavelength, of the plurality of adjacent light receiving areas.

10 Claims, 7 Drawing Sheets

PIXEL PORTION

CYAN    YELLOW

MANGENTA    GREEN

PIXEL PORTION

BLUE    FIRST GREEN COLOR

SECOND GREEN COLOR    RED

SOLID-STATE IMAGE PICKUP DEVICE WITH SHARED AMPLIFIER NEAREST PIXEL CORRESPONDING TO SHORTEST LIGHT WAVELENGTH AND ELECTRONIC APPARATUS USING THE SAME

BACKGROUND OF THE INVENTION

1. Field of the Invention

The present invention relates to a solid-state image pickup device and an electronic apparatus using the same, and more particularly to a solid-state image pickup device having a pixel portion composed of a plurality of light receiving areas, and having transistors used commonly to the light receiving areas, and an electronic apparatus using the same.

2. Description of the Related Art

Multiple pixel promotion in which a pixel is shrunk to increase the number of pixels within the same image area may be required for a solid-state image pickup device typified by a Complementary Metal Oxide Semiconductor (CMOS) image sensor. However, an absolute amount of energy made incident to a single pixel is reduced to deteriorate a sensitivity along with the multiple pixel promotion. This, for example, is described in Japanese Patent Laid-Open No. 2006-173634. In addition, the deterioration of the sensitivity depends on wavelengths. Therefore, the deterioration of the sensitivity appears in the form of output differences among a Red(R) pixel, a Green(G) pixel, and a Blue(B) pixel when primary color filters are used, and in the form of output differences among a yellow pixel, a cyan pixel, a magenta pixel, and a green pixel when complementary color filters are used. Such output differences cause disruption of a color balance.

SUMMARY OF THE INVENTION

FIG. 10A is a schematic top plan view showing an example of a layout pattern of a transistor sharing type CMOS image sensor. In general, transistors are disposed in the vicinity of a boundary portion between adjacent pixels, that is, in a position located far from a photodiode area. The disposition of the transistors is designed in consideration of transistor characteristics, a capacitance and the like.

In recent years, an imaging ability difference for each wavelength becomes a problem with the progress of the shrink of the pixel size. Thus, even when a focal point is fitted for the photodiode, as shown in FIG. 10B, energy profiles of the R, Gb (first green color), Gr (second green color), and B pixels on a surface of a silicon substrate are different from one another. The profile differences cause the problems such as the deterioration of the sensitivity, the color shading, and the like.

The present invention has been made in order to solve the problems described above, and it is therefore desirable to provide a solid-state image pickup device in which a layout of transistors is determined in consideration of not only characteristics of transistors, but also wavelengths handled in pixels, thereby adjusting a sensitivity balance for each color, and an electronic apparatus using the same.

In order to attain the desire described above, according to an embodiment of the present invention, there is provided a solid-state image pickup device including: a pixel portion in which a plurality of light receiving areas corresponding to different wavelengths, respectively, are disposed; and transistors used commonly to the plurality of adjacent light receiving areas in the pixel portion, and disposed so as to be brought near to a side of the light receiving area, corresponding to the shorter wavelength, of the plurality of adjacent light receiving areas.

In the embodiment of the present invention, the transistors commonly used are disposed so as to be brought near to the side of the light receiving area, corresponding to the shorter wavelength, of the adjacent light receiving areas in the plurality of light receiving areas corresponding to the different wavelength, respectively. As a result, a lot of lights can be made incident to the side of the light receiving area corresponding to a longer wavelength.

According to another embodiment of the present invention, there is provided an electronic apparatus, including: a solid-state image pickup device including a pixel portion in which a plurality of light receiving areas corresponding to different wavelengths, respectively, are disposed, and transistors used commonly to the plurality of adjacent light receiving areas in the pixel portion, and disposed so as to be brought near to a side of the light receiving area, corresponding to the shorter wavelength, of the adjacent light receiving areas; and an image processing portion configured to process signals received in the light receiving areas of the solid-state image pickup device in a form of an image.

According to the present embodiments, the occupation areas of the transistors are changed in accordance with the wavelength bands handled in the light receiving areas of the pixels. Therefore, it is possible to adjust the sensitivity balance for each color.

DETAILED DESCRIPTION OF THE PREFERRED EMBODIMENTS

The preferred embodiments of the present invention will be described in detail hereinafter with reference to the accompanying drawings. It is noted that the description will be given below in the following order.

1. First embodiment (the case of RGB color filter).
2. Second embodiment (the case of CMYG color filter).
3. Electronic apparatus (solid-state image pickup apparatus).

<1. First Embodiment>
[Structure of Solid-State Image Pickup Device]

Figure 1:
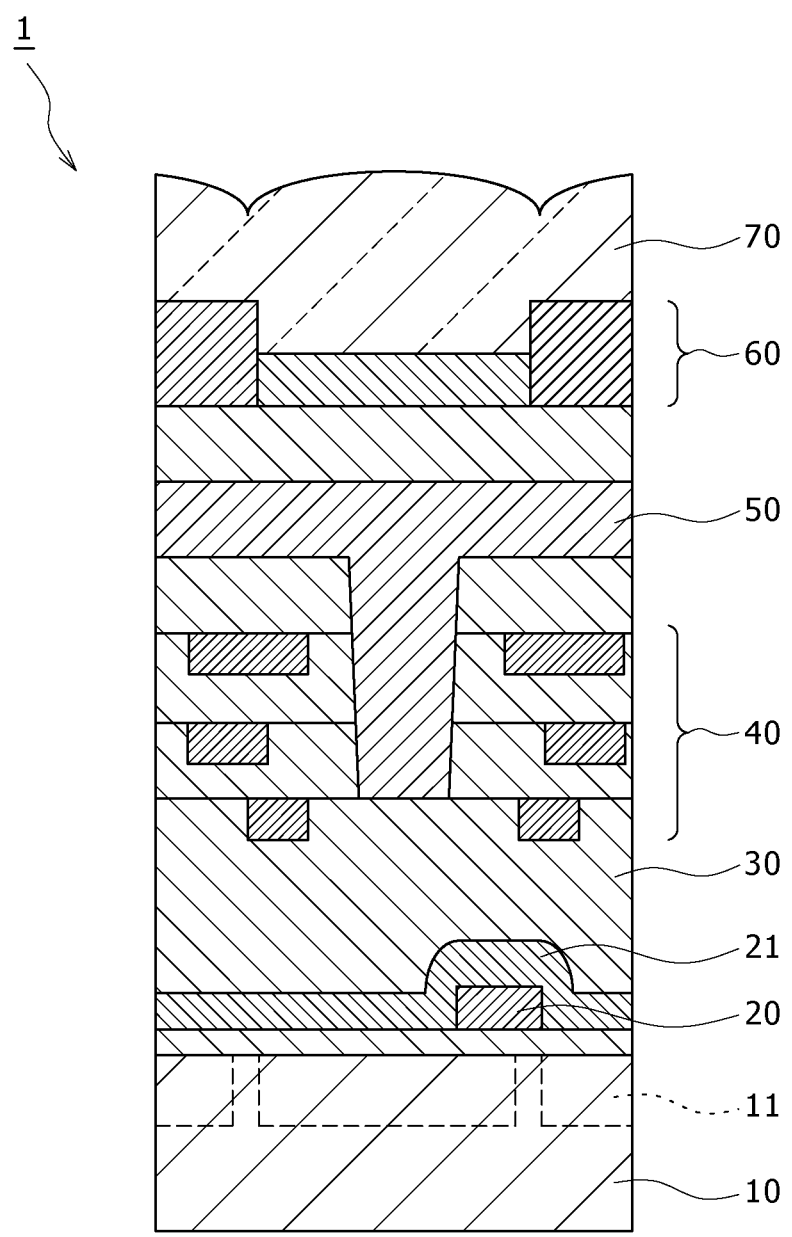
FIG. 1 is a schematic cross sectional view showing a structure of a solid-state image pickup device according to a first embodiment of the present invention.

FIG. 1 is a schematic cross sectional view showing a structure of a solid-state image pickup device according to the first embodiment of the present invention. Photodiodes 11 as light receiving areas are formed in a silicon substrate 10, and various kinds of transistors 20 are formed so as to correspond to the photodiodes 11, respectively.

A reading transistor, an amplifying transistor, a selecting transistor, a resetting transistor, and the like are given as the various kinds of transistors 20. In this case, the reading transistor reads out the electric charges fetched by the corresponding one of the photodiodes 11. The amplifying transistor amplifies an output signal from the corresponding one of the photodiodes 11. The selecting transistor selects the corresponding one of the photodiodes 11. Also, the resetting transistor exhausts the electric charges. Hence, the transistors 20 are used commonly to a plurality of light receiving areas as occasions demand.

An antireflection film 21 is formed over the transistor 20, and a plurality of wiring layers 40 are formed on the antireflection film 21 through an interlayer insulating film 30. An optical waveguide made from an organic film 50 is buried in the plurality of wiring layers 40, and RBG color filters 60 are formed above the organic film 50 every predetermined area in predetermined arrangement order. In addition, micro-lenses 70 are formed so as to correspond to the RBG color filters 60, respectively.

With the solid-state image pickup device 1 structured as described above, an outside light is condensed by the micro-lenses 70 to be separated into lights having wavelengths corresponding to predetermined colors, respectively, through the RGB color filters 60. The lights corresponding to R, G and B colors, respectively, reach the respective photodiodes 11 provided in the silicon substrate 21 through the optical waveguide made from the organic film 50. Also, the lights are subjected to photoelectric conversion in the respective photodiodes 11, thereby acquiring electrical signals corresponding to quantities of RGB lights, respectively, by driving operations of the transistors 20.

Figure 2:
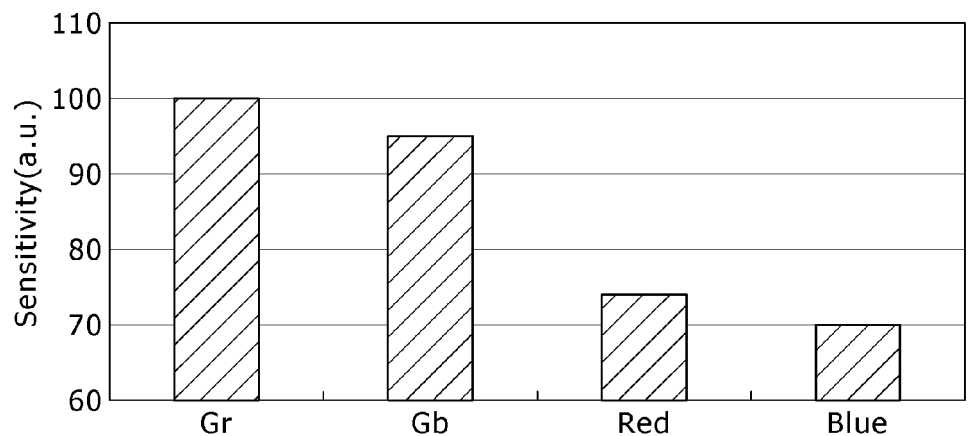
FIG. 2 is a graph explaining output voltages of light receiving areas corresponding to R, Gr, Gb and B colors, respectively, in a general solid-state image pickup device.
Figure 10A:
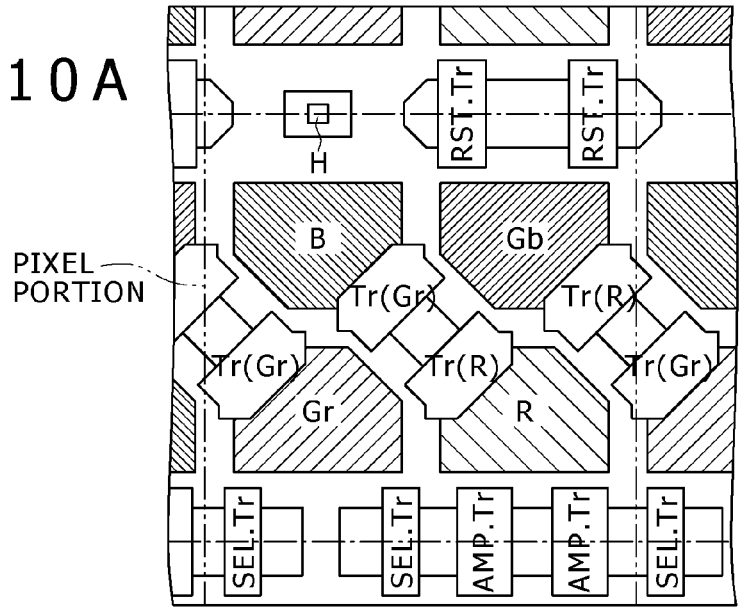
FIGS. 10A and 10B are respectively a schematic top plan view showing a layout pattern of a transistor sharing type CMOS image sensor, and a view showing energy profiles corresponding to a red color, a first green color, a second green color, and a blue color, respectively.

FIG. 2 is a graph explaining output voltages of the RGB colors by the general solid-state image pickup device shown in FIG. 10A. The general solid-state image pickup device includes color filters disposed in a matrix of 2×2. The color filters disposed in a matrix of 2×2 correspond to a red color, a blue color, a first green color, and a second green color, respectively. Referring to FIG. 2, the output voltage of the light let in through the color filter corresponding to the red color is indicated by "Red." In addition, the output voltage of the light let in through the color filter corresponding to the blue color is indicated by "Blue." In addition, the output voltage of the light let in through the color filter corresponding to the first green color (corresponding to a light receiving area corresponding to the green color disposed in a column on the side of a light receiving area corresponding to the blue color) is indicated by "Gb." Also, the output voltage of the light let in through the color filter corresponding to the second green color (corresponding to a light receiving area corresponding to the green color disposed in a column on the side of a light receiving area corresponding to the red color) is indicated by "Gr." It should be noted that in the first green color and the second green color are indicated in wavelength handled to each other.

Referring to FIG. 2, there are shown relative values of the output voltages "Gr," "Gb," "Red," and "Blue" when the output voltage "Gr" is set as 100. In the general solid-state image pickup device, when the output voltage "Gr" is set as 100, the output voltage "Gb" is about 95, the output voltage "Red" is about 74, and the output voltage "Blue" is about 70.

Figure 10B:
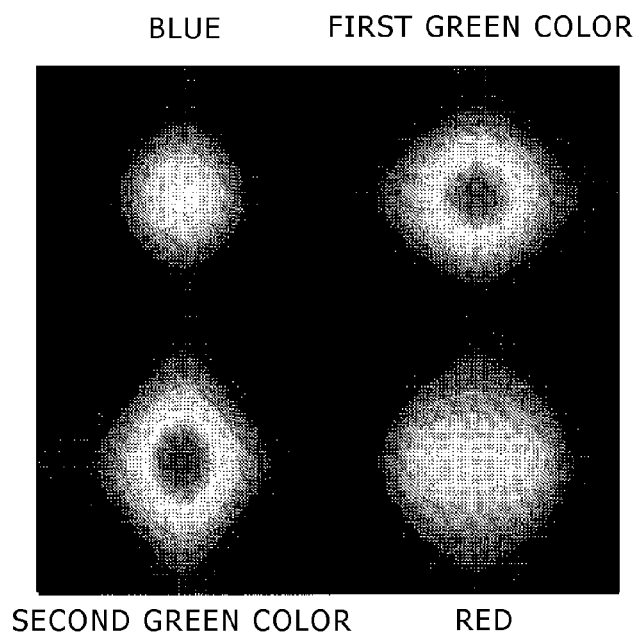

In the general solid-state image pickup device, a sensitivity of the output voltage "Gb" is lower than that of the output voltage "Gr" because the transistor is formed so as to protrude to the light receiving area corresponding to the first green color. The reason for this is because as with the energy profiles shown in FIG. 10B, the energy profile in the light receiving area Gr corresponding to the first green color spreads as compared with each of the energy profiles in the light receiving areas B and R corresponding to the blue color and the red color, respectively, and thus is influenced by the transistors disposed in the periphery of the light receiving areas R, Gb, Gr, and B. This causes the disruption of the sensitivity balance among the R, Gb, Gr, and B colors. The feature of the first embodiment is that the sensitivity balance among the red color, the first green color, the second green color, and the blue color is adjusted in consideration of the disposition of the transistors.

[Pixel Layout]

Figure 3:
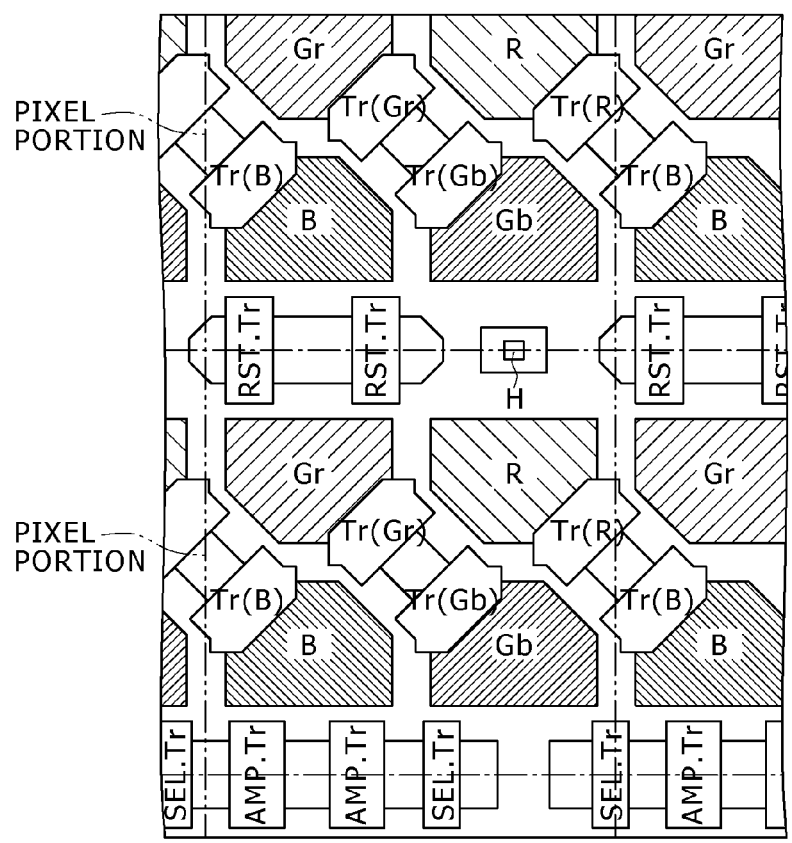
FIG. 3 is a schematic top plan view showing a pixel layout in the solid-state image pickup device of the first embodiment.

FIG. 3 is a schematic top plan view showing a pixel layout in the solid state image pickup device according to the first embodiment of the present invention. Referring to FIG. 3, pixel portions in each of which a plurality of light receiving areas corresponding to different wavelengths, respectively, are mainly shown. Light receiving areas are disposed in a matrix of 2×2 in one pixel portion (indicated by a chain double-dashed line in the figure). In a plurality of light receiving areas, the corresponding wavelengths are made different from one another by the color filters (not shown) formed on the side of incidence of the outside light. In the first embodiment, a size of the light receiving area is 1.75 μm².

In the case of FIG. 3, the four light receiving areas, that is, the light receiving area B corresponding to the blue color, the light receiving area R corresponding to the red color, the light receiving area Gb corresponding to the first green color (corresponding to the light receiving area Gb corresponding to the green color disposed in the column on the side of the light receiving area B corresponding to the blue color), and the light receiving area Gr corresponding to the second green color (corresponding to the light receiving area Gr corresponding to the green color disposed in the column on the side of the light receiving area B corresponding to the red color) are provided as the light receiving areas disposed in a matrix of 2×2. It should be noted that the first green color and the second green color are identical in wavelength handled to each other.

Of these four light receiving areas B, R, Gb, and Gr, the light receiving area B corresponding to the blue color and the light receiving area R corresponding to the red color are disposed in diagonal positions on one side, respectively. Also, the light receiving area Gb corresponding to the first green color and the light receiving area Gr corresponding to the second green color are disposed in diagonal positions on the other side, respectively.

Reading transistors Tr(B), Tr(R), and Tr(Gb), Tr(Gr) are formed between the light receiving areas B and R, and between the light receiving areas Gb and Gr, respectively. In this case, the reading transistors Tr(B) and Tr(R) read out the electric charges obtained in the photoelectric conversion in the light receiving areas B and R, respectively. Also, the reading transistors Tr(Gb) and Tr(Gr) read out the electric charges obtained in the photoelectric conversion in the light receiving areas Gb and Gr, respectively.

In addition, various kinds of transistors which are used commonly to the light receiving areas B, R, Gb and Gr are disposed in the periphery of the pixel portion. At least one of amplifying transistors AMP.Tr, resetting transistors RST.Tr, and a selecting transistor SEL.Tr is given as the transistors commonly used. In this case, each of the amplifying transistors AMP.Tr is provided in the form of a floating diffusion, and serves to convert the electric charges read out from corresponding one of the light receiving areas into the voltage. Each of the resetting transistors RST.Tr resets the electric charges. Also, the selecting transistor SEL.Tr selects the light receiving area becoming an object of the reading-out.

Figure 4:
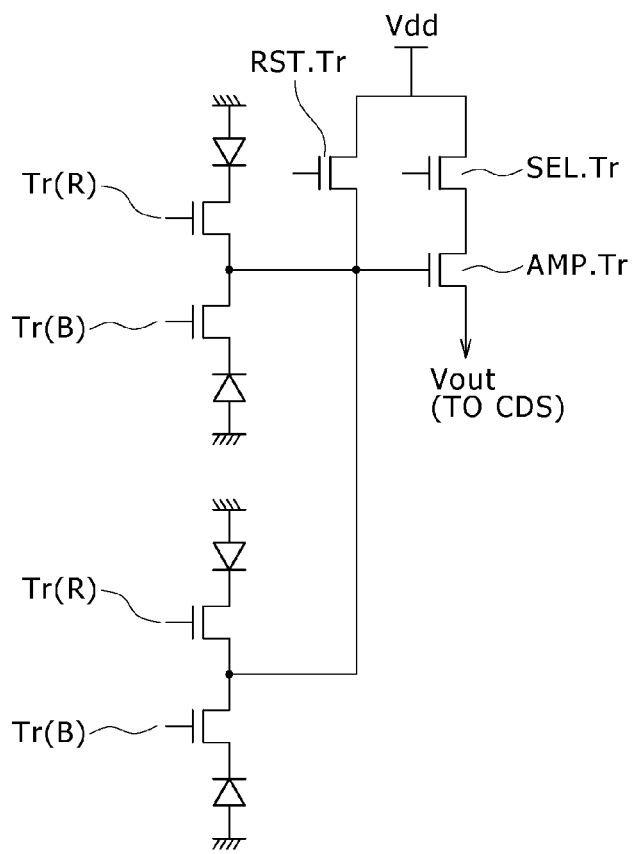
FIG. 4 is a circuit diagram of transistors disposed in a pixel portion of the solid-state image pickup device of the first embodiment.

FIG. 4 is a circuit diagram showing a configuration of the transistors disposed in the pixel portion. It is noted that although the transistors Tr(R), Tr(B), AMP.Tr, RST.TR, and SEL.Tr concerned with the light receiving areas R and B corresponding to the red color and the blue color, respectively, are shown in FIG. 4, the transistors Tr(Gb), Tr(Gr), AMP.Tr, RST.Tr, and SEL.Tr concerned with the light receiving areas Gb and Gr corresponding to the first and second green colors, respectively, are configured similarly to the case of FIG. 4.

In the first embodiment, of the pixel portions in each of which the light receiving areas are disposed in a matrix of 2×2, the two light receiving areas disposed along the diagonal line go with the two light receiving areas disposed along the same diagonal line as that of those two transistors in the pixel portion vertically adjacent to that pixel portion, thereby sharing the transistors between those four light receiving areas.

In the layout shown in FIG. 3, the light receiving area R corresponding to the red color, and the light receiving area B corresponding to the blue color go with each other in the pixel portions vertically adjacent to each other, thereby structuring a sharing unit of the four light receiving areas R, B, and R, B. In addition, the light receiving area Gb corresponding to the first green color, and the light receiving area Gr corresponding to the second green color go with each other, thereby structuring a sharing unit of the four light receiving areas Gb, Gr, and Gb, Gr.

The four light receiving areas structuring the sharing unit share the amplifying transistor AMP.Tr, the selecting transistors SEL.Tr, and the resetting transistor RST.Tr among these four light receiving areas.

In the circuit diagram shown in FIG. 4, of the sharing units, the pixel portions vertically adjacent to each other have a circuit configuration of the shared transistors Tr(R), Tr(B), and Tr(R), Tr(B), and AMP.Tr, RST.Tr, and SEL.Tr for the four light receiving areas composed of the light receiving areas R, R each corresponding to the red color, and the light receiving areas B, B each corresponding to the blue color.

In the circuit shown in FIG. 4, the reading transistor Tr(R) is connected to a photodiode in the light receiving area R corresponding to the red color, and the reading transistor Tr(B) is connected to a photodiode in the light receiving area B corresponding to the blue color. Output terminals of the reading transistor Tr(R) and the reading transistor Tr(B) are both connected to a gate terminal of the amplifying transistor AMP.Tr.

An output signal from the amplifying transistor AMP.Tr is controlled by the selecting transistor SEL.Tr. That is to say, the selecting transistor SEL.Tr operates in accordance with output timings of the reading transistors Tr(R) and Tr(B) to switch an amplitude of the signal corresponding to the red color, and an amplitude of the signal corresponding to the blue color over to each other.

A power source voltage Vdd is connected to the selecting transistor SEL.Tr, and thus an output signal corresponding to either the red color signal or the blue color signal inputted to the gate of the amplifying transistor AMP.Tr is sent to a Correlation Double Sampling (CDS) circuit.

On the other hand, the reading transistors Tr(R) and Tr(B) are also connected to the resetting transistor RST.Tr. When the resetting transistor RST.Tr is turned ON at a predetermined timing after completion of the signal output, a potential of the floating-diffusion becomes the power source potential Vdd, thereby providing a reset state.

Although FIG. 4 shows the circuit configuration of the sharing unit corresponding to the red color and the blue color, the above also applies to the circuit configuration of the sharing unit corresponding to the first green color and the second green color.

The feature of the first embodiment is that with regard to the layout of the transistors commonly used in the manner described above, these transistors are disposed so as to be brought near to the side of the light receiving area, corresponding to the shorter wavelength, of the adjacent light receiving areas.

Referring back to FIG. 3, the light receiving area B corresponding to the blue color, and the light receiving area Gb corresponding to the first green color are transversely adjacent to each other in the figure. In this case, since the blue color is shorter in wavelength than the green color, the transistors commonly used are disposed so as to be brought near to the side of the light receiving area B corresponding to the blue color. In the structure shown in FIG. 3, the selecting transistor SEL.Tr and the amplifying transistors AMP.Tr are disposed so as to be brought near to the side of the light receiving area B corresponding to the blue color. It is noted that the transistors other than the selecting transistor SEL.Tr and the amplifying transistor AMP.Tr may also be disposed so as to be brought near to the side of the light receiving area B corresponding to the blue color.

In addition, referring to FIG. 3 again, the light receiving area Gr corresponding to the second green and the light receiving area R corresponding to the red color are transversely adjacent to each other in the figure. In this case, since the green color is shorter in wavelength than the red color, the transistors commonly used are disposed so as to be brought near to the side of the light receiving area Gr corresponding to the second green color. In the structure shown in FIG. 3, the resetting transistors RST.Tr are disposed so as to be brought near to the side of the light receiving area Gr corresponding to the second green color. It is noted that the transistors other than the resetting transistors RST.Tr may also be disposed so as to be brought near to the side of the light receiving area Gr corresponding to the second green color.

In the first embodiment, the selecting transistor SEL.Tr and the amplifying transistors AMP.Tr commonly used are disposed so as to be brought near to the side of the light receiving area B corresponding to the blue color as compared with the circuit layout of the general solid-state image pickup device shown in FIG. 10A. Therefore, a wide space can be obtained in the periphery of the light receiving area Gb corresponding to the first green color. As a result, a balance between the output voltage from the light receiving area Gb corresponding to the first green color, and the output voltage from the light receiving area Gr corresponding to the second green color can be properly balanced as compared with the case of the general solid-state image pickup device shown in FIG. 10A.

In addition, the resetting transistor RST.Tr are disposed so as to be brought near to the side of the light receiving area Gr corresponding to the second green color. As a result, a contact hole H for grounding is provided in the vicinity, of the light receiving area R corresponding to the red color, having a space obtained therein.

[Sensitivity Comparison]

Figure 5:
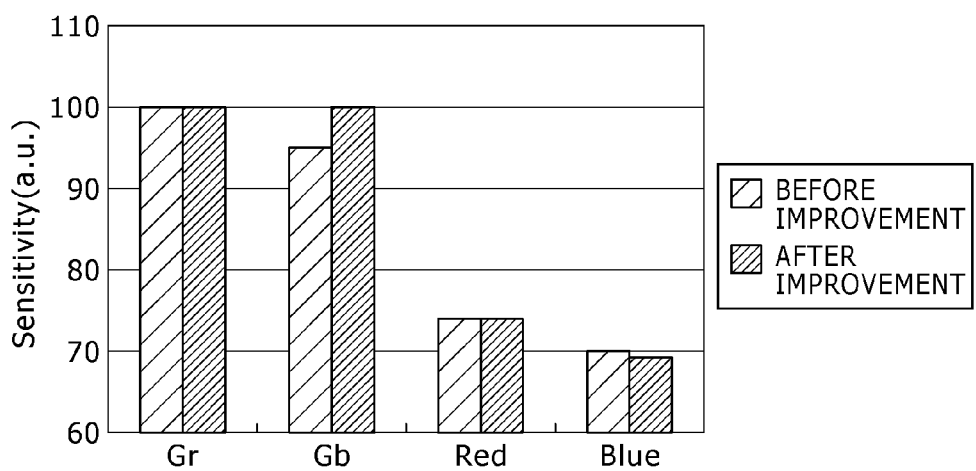
FIG. 5 is a graph explaining output voltages of light receiving areas corresponding to R, Gr, Gb and B colors, respectively, in a layout of transistors in the first embodiment.

FIG. 5 is a graph showing the output voltages from the light receiving areas R, Gb, Gr, and B corresponding to the red color, the first green color, the second green color, and the blue color in the circuit layout of the transistors in the first embodiment. In FIG. 5, the output voltage of the light let in through the color filter corresponding to the red color is indicated by "Red." In addition, the output voltage of the light let in through the color filter corresponding to the blue color is indicated by "Blue." In addition, the output voltage of the light let in through the color filter corresponding to the first green color is indicated by "Gb." Also, the output voltage of the light let in through the color filter corresponding to the second green color is indicated by "Gr." Moreover, FIG. 5 shows the sensitivities before an improvement in the layout, and the sensitivities after the improvement in the layout with respect to the output voltages Red, Blue, Gb, and Gr from the light receiving areas R, B, Gb, and Gr corresponding to the red color, the blue color, the first green color, and the second green color, respectively.

FIG. 5 shows relative values of the output voltages from the light receiving areas R, B, Gb, and Gr corresponding to the red color, the blue color, the first green color, and the second green color, respectively, when the output voltage Gr from the light receiving area "Gr" is set as 100. It is understood that when the layout of the transistors made as with the first embodiment is used, the sensitivity of the output voltage Gb from the light receiving area "Gb" can be improved with the deterioration of the sensitivity of the output voltage "Blue" being hardly caused.

The reason that the deterioration of the sensitivity of the output voltage "Blue" is hardly caused is as follows. That is to say, as with the energy profiles shown in FIG. 10B, the energy profile in the light receiving area B corresponding to the blue color is concentrated as compared with any of other energy profiles in the light receiving areas Gb, Gr and R corresponding to the first green color, the second green color, and the red color, respectively. For this reason, it is difficult for the output voltage "Blue" to receive an influence of the amplifying transistors AMP.Tr, the resetting transistors RST.Tr, and the selecting transistor SEL.Tr disposed in the periphery of the light receiving areas B, Gb, Gr, and R.

On the other hand, the reason that the sensitivity of the output voltage "Gb" can be improved is as follows. That is to say, the energy profile in the light receiving area Gb corresponding to the first green color spreads as compared with each of the energy profiles in the light receiving areas R and B corresponding to the red color and the blue color, respectively. As a result, none of the amplifying transistors AMP.Tr, the resetting transistors RST.Tr, and the selecting transistor SEL.Tr is disposed in the periphery of the light receiving area Gb corresponding to the first green color, whereby the effect of enhancement of the sensitivity can be sufficiently obtained.

As a result, the sensitivity of the light receiving area Gb corresponding to the first green color, and the sensitivity of the light receiving area Gr corresponding to the second green color can be justified without deteriorating the sensitivities of the light receiving areas B and R corresponding to the blue color and the red color, respectively. Therefore, it is possible to properly balance the sensitivities of the light receiving areas R, B, Gb, and Gr corresponding to the red color, the blue color, the first green color, and the second green color, respectively.

<2. Second Embodiment>

[Pixel Layout]

Figure 6A:
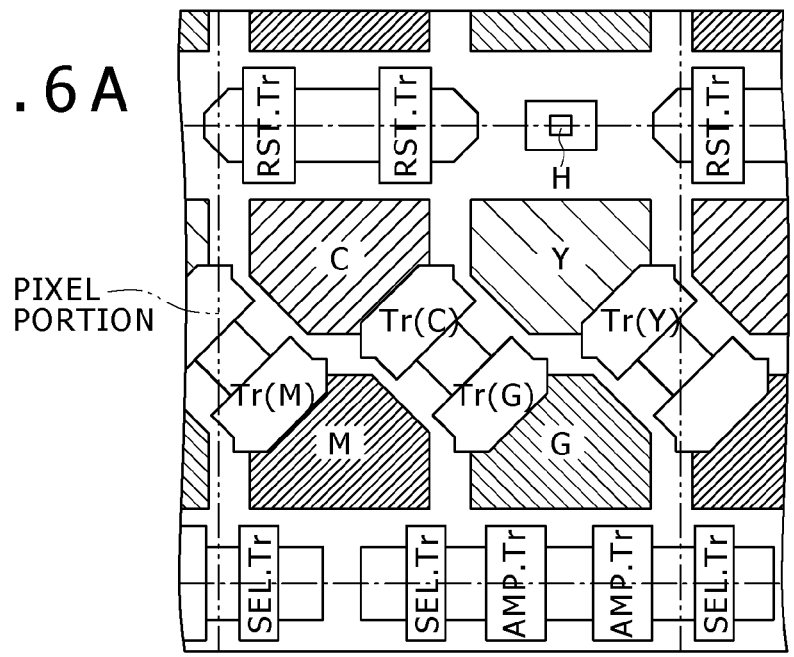
FIGS. 6A and 6B are respectively a schematic top plan view showing a solid-state image pickup device according to a second embodiment of the present invention, and a view showing energy profiles corresponding to a cyan color, a green color, a yellow color, and a magenta color when a layout of transistors shown in FIG. 10A is applied to an arrangement of complementary color filters.
Figure 6B:
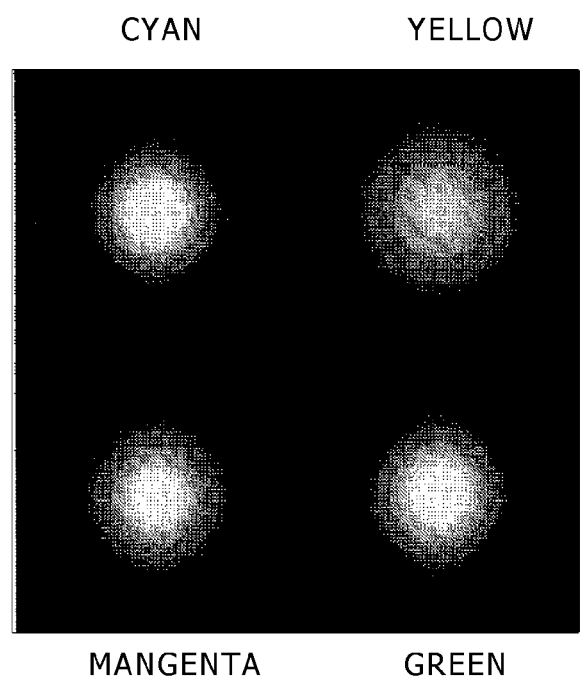

FIGS. 6A and 6B are respectively views explaining a solid-state image pickup device according to a second embodiment of the present invention. Specifically, FIG. 6A is a schematic top plan view showing a pixel layout in the solid-state image pickup device according to the second embodiment of the present invention, and FIG. 6B is a view showing energy profiles on the surface of the substrate surface.

In the second embodiment, complementary color filters are used for the colors handled in the light receiving areas. That is to say, light receiving areas are disposed in a matrix of 2×2 in one pixel portion. In a plurality of light receiving areas, the corresponding wavelengths are made different from one another by the complementary color filters (not shown) formed on the side of incidence of the outside light. In the second embodiment, a size of the light receiving area is 1.75 $\mu m^2$.

In the case of the pixel layout shown in FIG. 6A, four light receiving areas, that is, a light receiving area C corresponding to a cyan color, a light receiving area G corresponding to a green color, a light receiving area Y corresponding to a yellow color, and a light receiving area M corresponding to a magenta color are provided as light receiving areas disposed in a matrix of 2×2.

Of these four light receiving areas C, G, Y, and M, the light receiving area C corresponding to the cyan color, and light receiving area G corresponding to the green color are disposed in diagonal positions on one side, respectively. Also, the light receiving area Y corresponding to the yellow color, and the light receiving area M corresponding to the magenta color are disposed in diagonal positions on the other side, respectively.

Reading transistors Tr(C) and Tr(G), and Tr(Y) and Tr(M) are provided between the light receiving areas C and G disposed in diagonal positions on one side, respectively, and between the light receiving areas Y and M disposed in diagonal positions on the other side, respectively. In this case, the reading transistors Tr(C) and Tr(G) read out the electric charges obtained in the photoelectric conversion in the light receiving area C corresponding to the cyan color, and light receiving area G corresponding to the green color, respectively. Also, the reading transistors Tr(Y) and Tr(M) read out the electric charges obtained in the photoelectric conversion in the light receiving area Y corresponding to the yellow color, and the light receiving area M corresponding to the magenta color, respectively. In addition, a contact hole H for grounding is provided in the vicinity of the light receiving area Y corresponding to the yellow color.

The various kinds of transistors used commonly to the light receiving areas C, G, Y and M are disposed in the periphery of the pixel portion. The amplifying transistors AMP.Tr, the resetting transistors RST.Tr, and the selecting transistors SEL.Tr are given as the transistors used commonly. In this case, each of the amplifying transistors AMP.Tr is provided in the form of the floating diffusion, and serves to convert the electric charges read out from the corresponding one of the light receiving areas into the voltage. Each of the resetting transistors RST.Tr resets the electric charges. Also, each of the selecting transistors SEL.Tr selects the corresponding one of the light receiving areas becoming an object of the reading-out.

Here, when the layout of the transistors shown in FIG. 10A is applied to the arrangement of the complementary color filters as described above, the energy profiles, corresponding to the cyan color, the green color, the yellow color, and the magenta color, on the surface of the silicon substrate are as shown in FIG. 6B. In this case, it is understood from FIG. 6B that the energy profile, corresponding to the yellow color, on the surface of the silicon substrate is the lowest one, and thus the sufficient sensitivity can not be obtained in the light receiving area Y corresponding to the yellow color.

The feature of the second embodiment is that with regard to the layout of the transistors commonly used in the manner described above, these transistors are disposed so as to be brought near to the side of the light receiving area, corresponding to the shorter wavelength, of the adjacent light receiving areas.

Referring back to FIG. 6A, the light receiving area C corresponding to the cyan color, and the light receiving area Y corresponding to the yellow color are transversely adjacent to each other in the figure. In this case, since the cyan color is shorter in wavelength than the yellow color, the transistors commonly used are disposed so as to be brought near to the side of the light receiving area C corresponding to the cyan color. In the structure shown in FIG. 6A, the resetting transistors RST.Tr are disposed so as to be brought near to the side of the light receiving area C corresponding to the cyan color. It is noted that the transistors other than the resetting transistors RST.Tr may also be disposed so as to be brought near to the side of the light receiving area C corresponding to the cyan color.

In the second embodiment, the resetting transistors RST.Tr commonly used are disposed so as to be brought near to the side of the light receiving area C corresponding to the cyan color in the manner as described above. Therefore, a wide space can be obtained in the periphery of the light receiving area Y corresponding to the yellow color. As a result, the output voltage of the light receiving area Y corresponding to the yellow color can be increased as compared with the case where the transistors are disposed so as to be brought near to the side of the light receiving area Y corresponding to the yellow color.

[Sensitivity Comparison]

Figure 7:
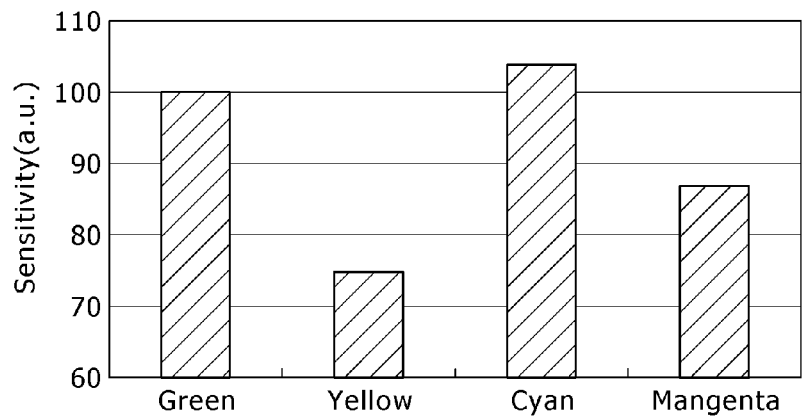
FIG. 7 is a graph explaining output voltages of light receiving areas corresponding to a cyan color, a green color, a yellow color, and a magenta color, respectively, when the layout of the transistors shown in FIG. 10A is applied the arrangement of the complementary color filters.

FIG. 7 is a graph showing the output voltages from the light receiving areas G, Y, C, and M corresponding to the green color, the yellow color, the cyan color, and the magenta color, respectively, when the layout of the transistors shown in FIG. 10A is applied to the arrangement of the complementary color filters as described above. In FIG. 7, the output voltage of the light let in through the color filter corresponding to the green color is indicated by "Green." In addition, the output voltage of the light let in through the color filter corresponding to the yellow color is indicated by "Yellow." In addition, the output voltage of the light let in through the color filter corresponding to the cyan color is indicated by "Cyan." Also, the output voltage of the light let in through the color filter corresponding to the magenta color is indicated by "Magenta." FIG. 7 shows relative values of the output voltages from the light receiving areas G, Y, C, and M corresponding to the green color, the yellow color, the cyan color, and the magenta color, respectively, when the output voltage "Green" from the light receiving area G is set as 100.

It is understood from the graph of FIG. 7 that the output voltage "Yellow" is low, that is, the sensitivity of the output voltage "Yellow" is lower than that of each of the output voltages "Green," "Cyan," and "Magenta."

Figure 8:
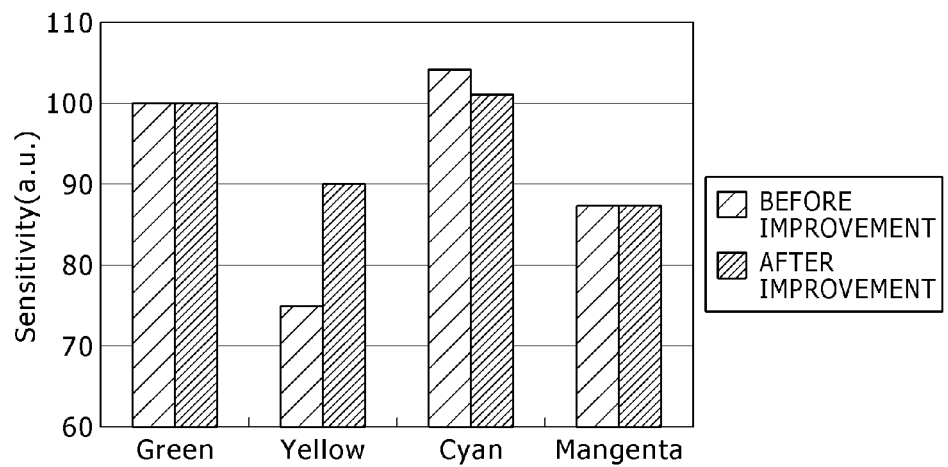
FIG. 8 is a graph explaining output voltages of light receiving areas corresponding to a cyan color, a green color, a yellow color, and a magenta color, respectively, in a layout of transistors in the second embodiment.

FIG. 8 is a graph showing the output voltages from the light receiving areas C, G, Y, and M corresponding to the cyan color, the green color, the yellow color, and the magenta color, respectively, in the case of the layout of the transistors in the second embodiment. FIG. 8 is also mentioned similarly to the case of the graph shown in FIG. 7. That is to say, the output voltage of the light let in through the color filter corresponding to the green color is indicated by "Green." In addition, the output voltage of the light let in through the color filter corresponding to the yellow color is indicated by "Yellow." In addition, the output voltage of the light let in through the color filter corresponding to the cyan color is indicated by "Cyan." Also, the output voltage of the light let in through the color filter corresponding to the magenta color is indicated by "Magenta." FIG. 5 shows the sensitivities before an improvement in the layout, and the sensitivities after the improvement in the layout with respect to the output voltages Green, Yellow, Cyan, and Magenta from the light receiving areas G, Y, C, and M corresponding to the green color, the yellow color, the cyan color, and the magenta color, respectively.

FIG. 8 shows relative values of the output voltages from the light receiving areas G, Y, C, and M corresponding to the green color, the yellow color, the cyan color, and the magenta color, respectively, when the output voltage "Green" from the light receiving area G is set as 100. It is understood from the graph of FIG. 8 that when the layout of the transistors in the second embodiment is used, the sensitivity of the output voltage "Yellow" from the light receiving area Y corresponding to the yellow can be improved with the deterioration of the sensitivity of the output voltage "Cyan" being hardly caused.

The fact that the deterioration of the sensitivity of the output voltage "Cyan" is hardly caused is grasped from the energy profile shown in FIG. 6B. That is to say, the reason for this is because the energy profile in the light receiving area C corresponding to the cyan color is concentrated as compared with any of other energy profiles in the light receiving areas G, Y and M corresponding to the green color, the yellow color, and the magenta color, respectively. For this reason, it is difficult for the output voltage "Cyan" to receive an influence of the amplifying transistors AMP.Tr, the resetting transistors RST.Tr, and the selecting transistors SEL.Tr disposed in the periphery of the light receiving areas G, Y, C, and M.

On the other hand, the reason that the sensitivity of the output voltage "Yellow" can be improved is as follows. That is to say, the energy profile in the light receiving area Y corresponding to the yellow color spreads as compared with each of the energy profiles in the light receiving areas C, M and G corresponding to the cyan color, the magenta color and the green color, respectively. As a result, none of the amplifying transistors AMP.Tr, the resetting transistors RST.Tr, and the selecting transistors SEL.Tr is disposed in the periphery of the light receiving area Y corresponding to the yellow color, whereby the effect of enhancement of the sensitivity can be sufficiently obtained.

As a result, the sensitivity of the light receiving area Y corresponding to the yellow color can be enhanced without deteriorating the sensitivity of the light receiving area C corresponding to the cyan color. Therefore, it is possible to properly balance the sensitivities of the light receiving areas C, G, Y, and M corresponding to the cyan color, the green color, the yellow color, and the magenta color, respectively.

It should be noted that although in each of the first and second embodiments, the light receiving areas of the pixel portion are disposed in a matrix of 2×2, the present invention is by no means limited thereto. That is to say, the present invention can also be applied to any other suitable case where, for example, the light receiving areas of the pixel portion are disposed in a matrix of 2×4. In addition, the arrangement of the colors to which the light receiving areas composing the pixel portion correspond, respectively, is by no means limited to each of the cases of the first and second embodiments.

3. Electronic Apparatus

Figure 9:
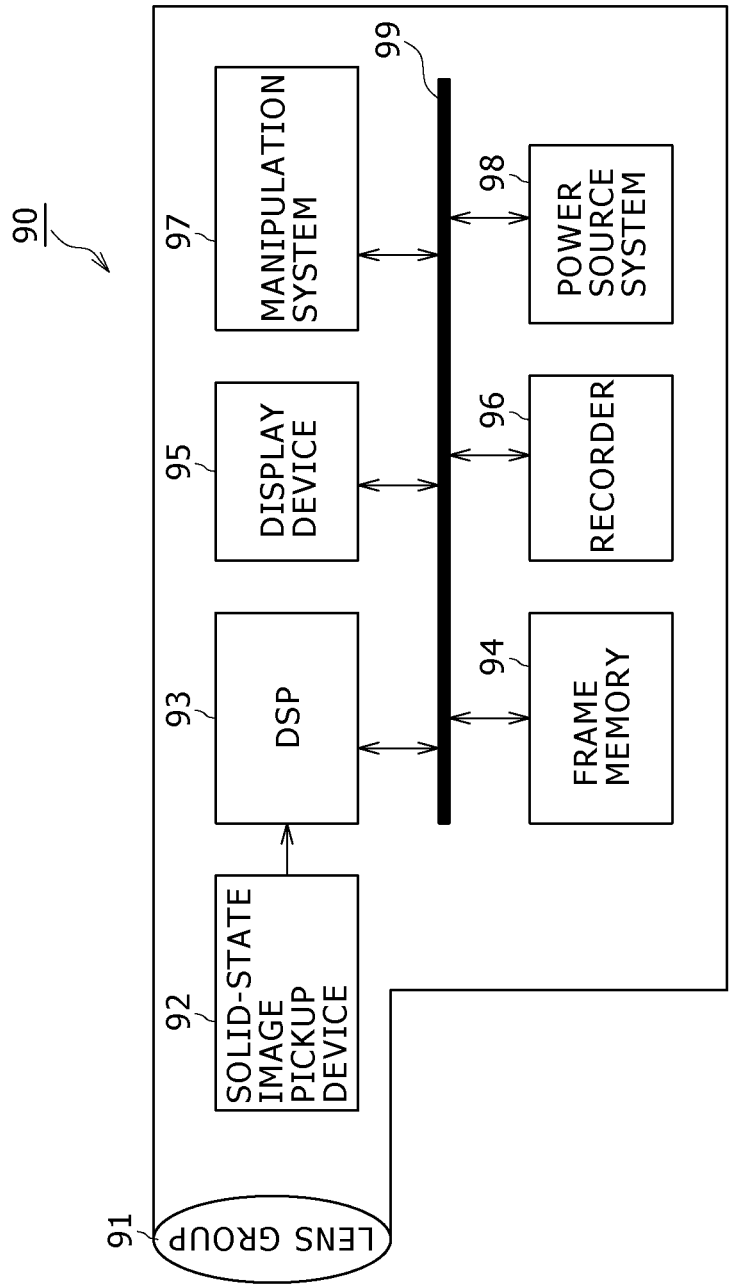
FIG. 9 is a block diagram showing a configuration of a solid-state image pickup apparatus as a electronic apparatus according to an embodiment of the present invention.

FIG. 9 is a block diagram showing a configuration of an image pickup apparatus as an electronic apparatus according to an embodiment of the present invention. As shown in FIG. 9, the image pickup apparatus 90 has an optical system including a lens group 91, a solid-state image pickup device 92, a DSP circuit 93 as a camera signal processing circuit, a frame memory 94, a display device 95, a recorder 96, a manipulation system 97, a power source system 98, and the like. Of these constituent elements, the DSP circuit 93, the frame memory 94, the display device 95, the recorder 96, the manipulation system 97 and the power source system 98 are connected to one another through a bus line 99.

The lens group 91 lets in an incident light (image light) from a subject, thereby imaging the incident light on an imaging area of the solid-state image pickup device 92. The solid-state image pickup device 92 converts a light quantity of incident light imaged on the imaging area of the solid-state image pickup device 92 by the lens group 91 into an electrical signal in pixels, and outputs the resulting electrical signal as a pixel signal. The solid-state image pickup device of any of the first and second embodiments previously stated is used as the solid-state image pickup device 92.

The display device is composed of a panel type display device such as a liquid crystal display device or an organic Electro Luminescence (EL) display device, and displays thereon either a moving image or a still image captured by the solid-state image pickup device 92. Also, the recorder 96 records image data on either the moving image or the still image in a recording medium such as a non-volatile memory, a video tape or a Digital Versatile Disk (DVD).

The manipulation system 97 issues manipulation commands about various kinds of functions which the image pickup apparatus 90 has under the manipulation made by a user. The power source system 98 suitably supplies various kinds of power sources becoming operation power sources for the DSP circuit 93, the frame memory 94, the display device 95, the recorder 96, and the manipulation system 97 to these objects of the power supply.

Such an image pickup device 90 is applied to a video camera, a digital still camera, and a camera module for a mobile apparatus such as a mobile phone. Any of the solid-state image pickup devices of the first and second embodiments previously stated is used as the solid-state image pickup apparatus 92, whereby it is possible to provide the solid-state image pickup apparatus having the superior color balance.

The present application contains subject matter related to that disclosed in Japanese Priority Patent Application JP 2008-325073 filed in the Japan Patent Office on Dec. 22, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup device comprising:

a pixel region having a plurality of light receiving areas arranged relatively in columns and rows, the light receiving areas configured to convert light into signal charges, the light receiving areas corresponding to at least four light wavelengths, at least three of which are different, each light receiving area corresponding to one light wavelength; and transistors including signal charge amplifying transistors and reset transistors, wherein, light receiving areas corresponding to a first light wavelength and light receiving areas corresponding to a second light wavelength alternate along a first row, the first light wavelength being different from the second light wavelength, light receiving areas corresponding to a third light wavelength and light receiving areas corresponding to a fourth light wavelength alternate along a second row adjacent to the first row, the third light wavelength being different from the fourth light wavelength, the light receiving areas corresponding to the first light wavelength and the light receiving areas corresponding to the third light wavelength alternate along a first column, the light receiving areas corresponding to the second light wavelength and the light receiving areas corresponding to the fourth light wavelength alternate along a second column adjacent to the first column, respective diagonally adjacent light receiving areas form a light receiving area pair, two light receiving area pairs adjacent along a column direction are commonly connected to a respective signal charge amplifying transistor and a respective reset transistor, one of the respective amplifying transistor and the respective reset transistor is located in a first peripheral region facing the light receiving areas in the first and second columns along the first row, and is positioned nearer to a side of a light receiving area of the light receiving areas in the first and second columns along the first row that corresponds to a shorter light wavelength such that a first substantial space without a transistor disposed therein exists in a periphery of the other one the light receiving areas in the first and second columns along the first row, and a remaining one of the respective amplifying transistor and the respective reset transistor is located in a second peripheral region facing the light receiving areas in the first and second columns along the second row, and is positioned nearer to a side of a light receiving area of the light receiving areas in the first and second columns along the second row that corresponds to a shorter light wavelength such that a second substantial space without a transistor disposed therein exists in a periphery of the other one of the light receiving areas in the first and second columns along the second row.

2. The solid-state image pickup device according to claim 1, wherein:

a light receiving area corresponding to a blue color and a light receiving area corresponding to a red color form a first light receiving area pair, and a light receiving area corresponding to a first green color and a light receiving area corresponding to a second green color form a second light receiving area pair adjacent to the first light receiving area pair along a row direction, the light receiving area corresponding to the second green color and the light receiving area corresponding to the blue color being adjacent along the first column, the light receiving area corresponding to the red color and the light receiving area corresponding to the first green color being adjacent along the second column, the one of the respective amplifying transistor and the respective reset transistor is positioned nearer to a side of the light receiving area corresponding to the blue color such that a first substantial space without a transistor disposed therein exists in a periphery of the light receiving area corresponding to the first green color, and the remaining one of the respective amplifying transistor and the respective reset transistor is positioned nearer to a side of the light receiving area corresponding to the second green color such that a second substantial space without a transistor disposed therein exists in a periphery of the light receiving area corresponding to the red color.

3. The solid-state image pickup device according to claim 2, wherein a contact hole for grounding is in a vicinity of the light receiving area corresponding to the red color.

4. The solid-state image pickup device according to claim 1, wherein the transistors include signal charge amplifying transistors, reset transistors, and selection transistors.

5. The solid-state image pickup device according to claim 1, wherein the two light receiving area pairs adjacent along the column direction are further commonly connected to a respective selection transistor.

6. An electronic apparatus, comprising:
an optical system;
a solid-state image pickup device, wherein light is imaged on an imaging area of the solid-state image pickup device, and wherein the solid-state image pickup device includes:
  a pixel region having a plurality of light receiving areas arranged relatively in columns and rows, the light receiving areas configured to convert light into signal charges, the light receiving areas corresponding to at least four light wavelengths, at least three of which are different, each light receiving area corresponding to one light wavelength; and
  transistors including signal charge amplifying transistors and reset transistors,
  wherein,
    light receiving areas corresponding to a first light wavelength and light receiving areas corresponding to a second light wavelength alternate along a first row, the first light wavelength being different from the second light wavelength,
    light receiving areas corresponding to a third light wavelength and light receiving areas corresponding to a fourth light wavelength alternate along a second row adjacent to the first row, the third light wavelength being different from the fourth light wavelength,
    the light receiving areas corresponding to the first light wavelength and the light receiving areas corresponding to the third light wavelength alternate along a first column,
    the light receiving areas corresponding to the second light wavelength and the light receiving areas corresponding to the fourth light wavelength alternate along a second column adjacent to the first column,
    respective diagonally adjacent light receiving areas form a light receiving area pair,
    two light receiving area pairs adjacent along a column direction are commonly connected to a respective signal charge amplifying transistor and a respective reset transistor,
    one of the respective amplifying transistor and the respective reset transistor is located in a first peripheral region facing the light receiving areas in the first and second columns along the first row, and is positioned nearer to a side of a light receiving area of the light receiving areas in the first and second columns along the first row that corresponds to a shorter light wavelength such that a first substantial space without a transistor disposed therein exists in a periphery of the other one the light receiving areas in the first and second columns along the first row, and
    a remaining one of the respective amplifying transistor and the respective reset transistor is located in a second peripheral region facing the light receiving areas in the first and second columns along the second row, and is positioned nearer to a side of a light receiving area of the light receiving areas in the first and second columns along the second row that corresponds to a shorter light wavelength such that a second substantial space without a transistor disposed therein exists in a periphery of the other one of the light receiving areas in the first and second columns along the second row;
  a digital signal processor circuit, wherein the digital signal processor circuit receives an output from the solid-state image pickup device.

7. The electronic apparatus of claim 6, wherein a light receiving area corresponding to a blue color and a light receiving area corresponding to a red color form a first light receiving area pair, and a light receiving area corresponding to a first green color and a light receiving area corresponding to a second green color form a second light receiving area pair adjacent to the first light receiving area pair along a row direction, the light receiving area corresponding to the second green color and the light receiving area corresponding to the blue color being adjacent along the first column, the light receiving area corresponding to the red color and the light receiving area corresponding to the first green color being adjacent along the second column, the one of the respective amplifying transistor and the respective reset transistor is positioned nearer to a side of the light receiving area corresponding to the blue color such that a first substantial space without a transistor disposed therein exists in a periphery of the light receiving area corresponding to the first green color, and the remaining one of the respective amplifying transistor and the respective reset transistor is positioned nearer to a side of the light receiving area corresponding to the second green color such that a second substantial space without a transistor disposed therein exists in a periphery of the light receiving area corresponding to the red color.

8. The electronic apparatus of claim 7, wherein a contact hole for grounding is in a vicinity of the light receiving area corresponding to the red color.

9. The electronic apparatus of claim 6, wherein the transistors include signal charge amplifying transistors, reset transistors, and selection transistors.

10. The electronic apparatus of claim 6, wherein the two light receiving area pairs adjacent along the column direction are further commonly connected to a respective selection transistor.

* * * * *